United States Patent [19]
Hong

[11] Patent Number: 5,972,752
[45] Date of Patent: Oct. 26, 1999

[54] METHOD OF MANUFACTURING A FLASH MEMORY CELL HAVING A TUNNEL OXIDE WITH A LONG NARROW TOP PROFILE

[75] Inventor: Gary Hong, Hsin-Chu, Taiwan

[73] Assignee: United Semiconductor Corp., Taiwan

[21] Appl. No.: 08/998,725

[22] Filed: Dec. 29, 1997

[51] Int. Cl.[6] .................................................. H01L 21/8247
[52] U.S. Cl. ............................................. 438/264; 438/559
[58] Field of Search .................................... 438/263, 264, 438/265, 530, 532, 559, 564

[56] References Cited

U.S. PATENT DOCUMENTS

| | | | |
|---|---|---|---|
| 5,516,713 | 5/1996 | Hsue et al. | 438/264 |
| 5,744,391 | 4/1998 | Chen | 438/264 |
| 5,817,557 | 10/1998 | Baldi | 438/264 |

*Primary Examiner*—Chandra Chaudhari
*Attorney, Agent, or Firm*—Rabin & Champagne, P.C.

[57] ABSTRACT

A method for forming a flash memory cell structure comprising the steps of providing a semiconductor substrate, and then sequentially forming a bottom conductive layer and a cap oxide layer over the substrate. Next, a pattern is defined in the conductive layer and the cap oxide layer. Subsequently, a thermal oxidation method is used to form a silicon oxide layer on the sidewalls of the bottom conductive layer. Then, a gate oxide layer is formed between the bottom conductive layers above the substrate. Thereafter, source/drain regions are formed in the semiconductor substrate. Then, spacer structures are formed adjacent to the silicon oxide layers. Using the spacer structures as masks, a portion of the gate oxide layer is etched. Then, the spacer structures are removed to expose the gate oxide layer. Next, a thermal oxidation method is used to form a tunneling oxide layer in the narrow region between the gate oxide layer. The tunneling oxide layer has a long narrow top profile. Finally, a floating gate layer, a dielectric layer and a control gate are sequentially formed to complete the flash memory cell structure.

17 Claims, 7 Drawing Sheets

METHOD OF MANUFACTURING A FLASH MEMORY CELL HAVING A TUNNEL OXIDE WITH A LONG NARROW TOP PROFILE

BACKGROUND OF THE INVENTION

1. Field of Invention

The present invention relates to a method of manufacturing a flash memory cell. More particularly, the present invention relates to a method of manufacturing an NAND-type flash memory cell that has a high coupling ratio and a low source/drain resistance. Additionally, when a programming or erasing operation is performed using the Fowler-Nordheim (F-N) tunneling effect, the operating voltage applied for proper working of the flash memory is lowered.

Description of Related Art

In general, the gate of a conventional flash memory has two layers, namely, a floating gate and a control gate. The floating gate layer fabricated from polysilicon material is used for the storage of electric charges. Normally, the floating gate is in a floating state because it does not have any direct connection with outside circuits. Above the floating gate is a control gate, which is used for controlling the storage and retrieval of data. Normally, the control gate is connected to a word line. The aforementioned floating gate and the control gate together constitutes a gate terminal structure, which is commonly referred to as a stacked gate. Since a flash memory can provide fast programming and erasing operations, it is a very popular type of erasable programmable read-only memory (EPROM). In general, the speed of a read or a write operation in a flash memory depends very much on the transferring speed of electrons from the floating gate to the source/drain terminal. For a flash memory structure having a high coupling ratio, the electric field necessary to initiate an F-N tunneling is small. In other words, the speed of transfer of electrons from the floating gate to the source/drain region is fast. Therefore, at present, the method to produce a flash memory structure that has a high coupling ratio is an important issue in semiconductor manufacture.

The conventional method of increasing coupling ratio in a flash memory includes increasing the overlapping area between the floating gate and the control gate, or decreasing the tunneling oxide area beneath the floating gate. However, according to the design rule, the flash memory must have a minimum size in the wafer in order for its layout to have the highest density. Under this condition, the overlapping area between the floating gate and the control gate above is limited, and therefore, a high coupling ratio is difficult to obtain. When the coupling ratio is low, a higher voltage must be supplied in order to operate the memory programming and erasing actions. For example, a voltage as high as 15V to 18V is needed. A high operating voltage makes any dimensional reduction of the flash memory very difficult. Besides, a thick gate oxide layer must be supplied to the peripheral MOS transistors to deal with the high voltage. For example, the thickness must be increased to about 200 Å to withstand the high voltage. This will increase the difficulties in implementing the design.

In light of the foregoing, there is a need in the art to provide an improved flash memory cell structure.

SUMMARY OF THE INVENTION

Accordingly, the present invention is directed to provide a method of manufacturing a flash memory cell. The method utilizes the reduction in tunneling oxide area beneath the floating gate not only to increase the coupling ratio, but also to lower the operating voltage required for programming and erasing operations.

To achieve these and other advantages and in accordance with the purpose of the invention, as embodied and broadly described herein, the invention provides a method for forming a flash memory cell structure. The method comprises the steps of providing a semiconductor substrate, and then sequentially forming a bottom conductive layer and a cap oxide layer over the substrate. Next, a pattern is defined in the conductive layer and the cap oxide layer. Subsequently, a thermal oxidation method is used to form a silicon oxide layer on the sidewalls of the bottom conductive layer. Then, a gate oxide layer is formed in an opening between the bottom conductive layer above the substrate. Thereafter, source/drain regions are formed in the semiconductor substrate. Then, spacer structures are formed adjacent to the silicon oxide layer. Using the spacer structures as masks, a portion of the gate oxide layer is etched. Then, the spacer structures are removed to expose the gate oxide layer. Next, a thermal oxidation method is used to form a tunneling oxide layer in the narrow region between the gate oxide layers. The tunneling oxide layer has a long narrow top profile. Finally, a floating gate layer, a dielectric layer and a control gate are sequentially formed to complete the formation of the flash memory cell structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A through 7A are cross-sectional views along line AA' in FIG. 1 showing the progression of manufacturing steps in the fabrication of an NAND-type flash memory cell according to one preferred embodiment of this invention; and FIGS. 2B through 7B are cross-sectional views along line BB' in FIG. 1 showing the progression of manufacturing steps in the fabrication of an NAND-type flash memory cell according to one preferred embodiment of this invention.

DESCRIPTION OF THE PREFERRED EMBODIMENTS

Figure 1:
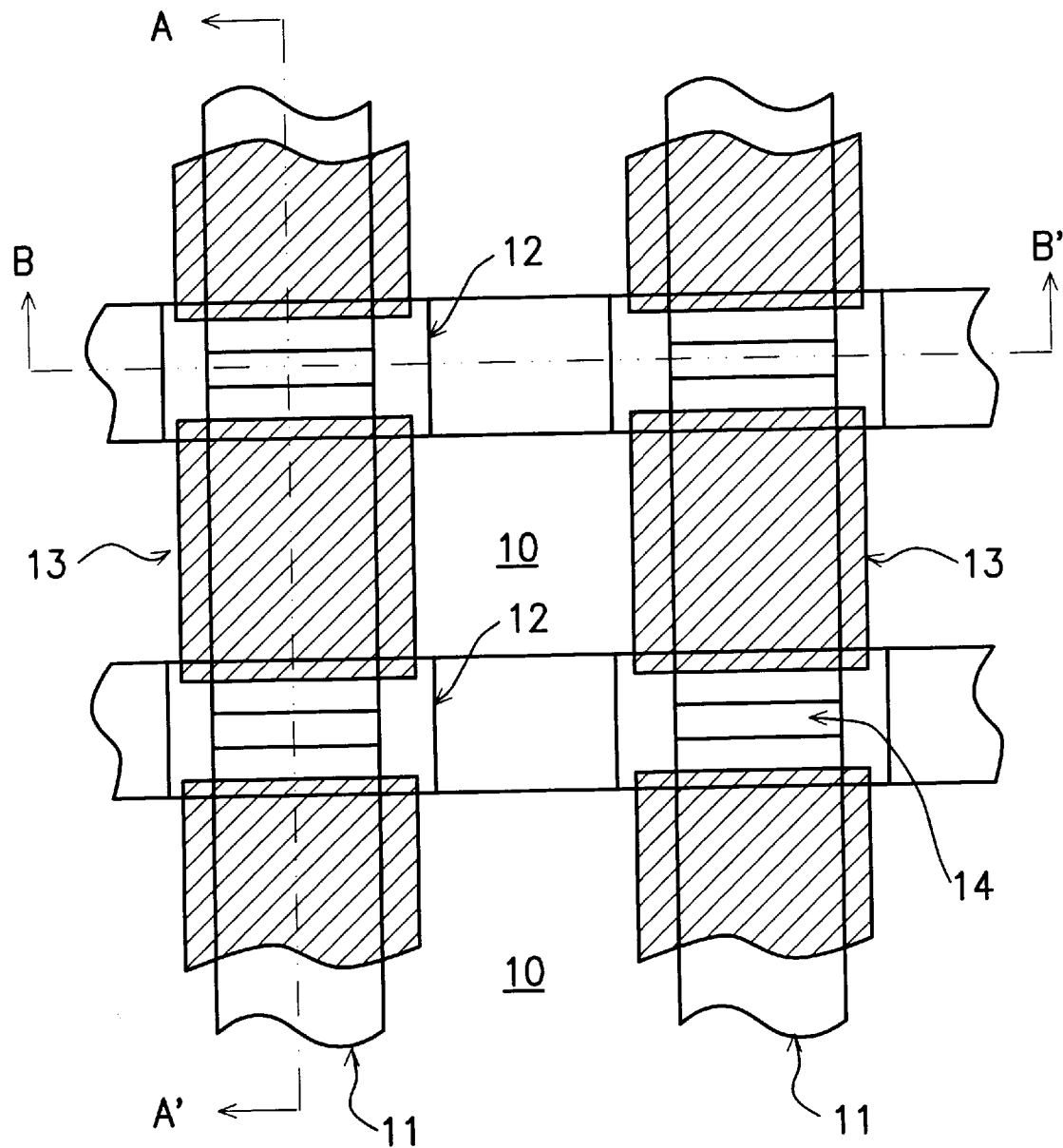
FIG. 1 is a top view showing an NAND-type flash memory cell structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In a flash memory, the gate voltage that needs to be applied for programming and erasing operations is closely related to the coupling ratio. The higher the coupling ratio, the smaller will be the electric field necessary for F-N tunneling to occur. In other words, the higher the coupling ratio, the easier will be for the electrons to penetrate through the tunneling oxide layer, hence, the gate voltage necessary for the programming and the erasing operations is reduced.

This invention provides an improved type of flash memory cell design and its method of manufacture. The flash memory cell has NAND-type logic, and has a high coupling ratio. The characteristic of this invention is that the tunneling oxide surface area is rather small. Through the reduction in the tunneling oxide surface area, a high coupling ratio and a low source/drain resistance can be obtained. Therefore, the operating voltage necessary for bringing out F-N tunneling for programming or erasing operation is low, thereby improving the operational conditions of a conventional method.

FIG. 1 is a top view showing an NAND-type flash memory cell according to one preferred embodiment of this invention. First, as shown in FIG. 1, some insulation regions 10 are distributed over a substrate (not shown). The insulation regions, for example, can be a field oxide layer or a trench isolation structure for isolating and patterning active regions 11. The active regions 11 have a linear structure. Within the boundary of an active region 11 and its surrounding areas are structures including floating gates 12, bottom conductive layers 13 and tunneling oxide layers 14. The floating gate 12 and the bottom conductive layer are polysilicon layers. The tunneling oxide layer 14 is a thin oxide layer whose thickness can be varied but normally is about 70 Å. Control gates 15 (not shown), which have a long narrow top profile, are distributed above the floating gates 12. Each control gate 15 is made from a polysilicon layer, and is aligned in a direction perpendicular to the active regions 11. In general, a control gate functions as a word line. On each side of the control gate 15 in the substrate, ion-doped regions are also formed serving as source or drain regions. The surface area of the tunneling oxide layer is rather small, and the method to produce such an oxide structure is described in detail below with reference to FIGS. 2 through 7.

Figure 2A:
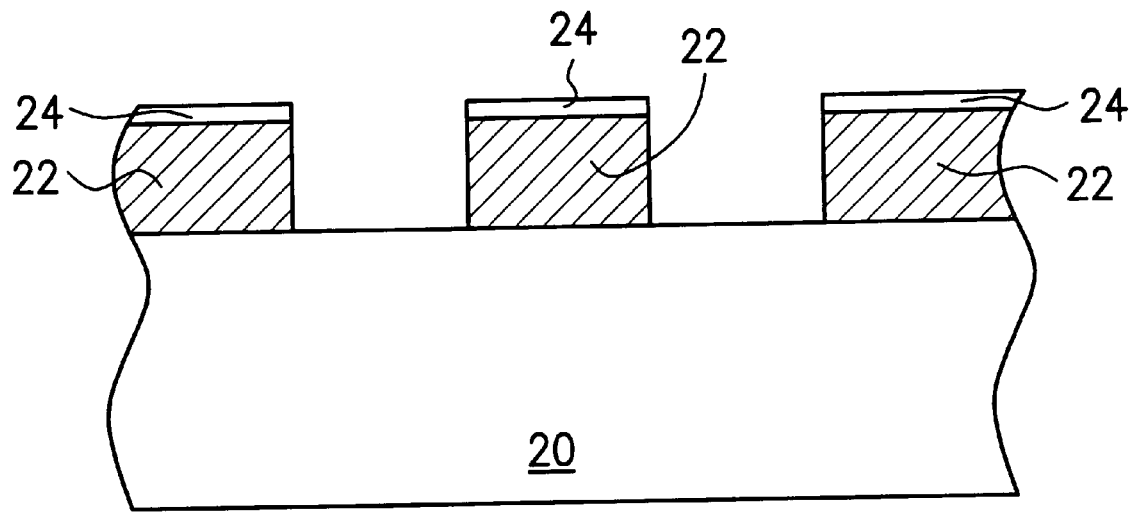
Figure 2B:
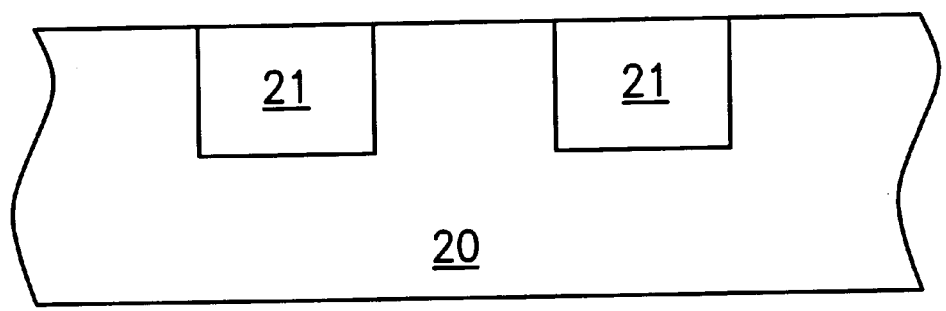

FIGS. 2A through 7A are cross-sectional views along line AA' in FIG. 1 showing the progression of manufacturing steps in the fabrication of an NAND-type flash memory cell according to one preferred embodiment of this invention. FIGS. 2B through 7B are cross-sectional views along line BB' in FIG. 1 showing the progression of manufacturing steps in the fabrication of an NAND-type flash memory cell according to one preferred embodiment of this invention. First, as shown in FIGS. 2A and 2B, a semiconductor substrate 20 is provided. Then, insulating regions 21 are formed over the substrate 20. The insulating regions 21 can be, for example, an oxide layer or a trench region having silicon dioxide material in it for isolating and patterning the boundary of the active region. Next, a bottom conductive layer 22 is formed in the active region of the substrate 20. The method for forming the bottom conductive layer 22 includes depositing polysilicon using a chemical vapor deposition (CVD) method. Thereafter, a cap oxide layer 24 is formed over the bottom conductive layer 22. The cap oxide layer can be formed, for example, by depositing silicon dioxide to a thickness of about 100 Å to 1000 Å using a chemical vapor deposition (CVD) method. In a subsequent step, an ion implantation is performed implanting arsenic (As) or phosphorus (P) ions into the bottom conductive layer 22. Photolithographic and etching processes are then used to pattern the bottom conductive layer 22 and the cap oxide layer 24, forming a structure as shown in FIG. 2A. The bottom conductive layer 22 is a means for forming a stacked gate having a sharp undulating three-dimensional profile in subsequent processes. This stacked gate structure is capable of reducing the overall device dimensions and able to provide a larger overlapping area between the floating gate and the control gate. Consequently, the coupling ratio of the device is increased.

Figure 3A:
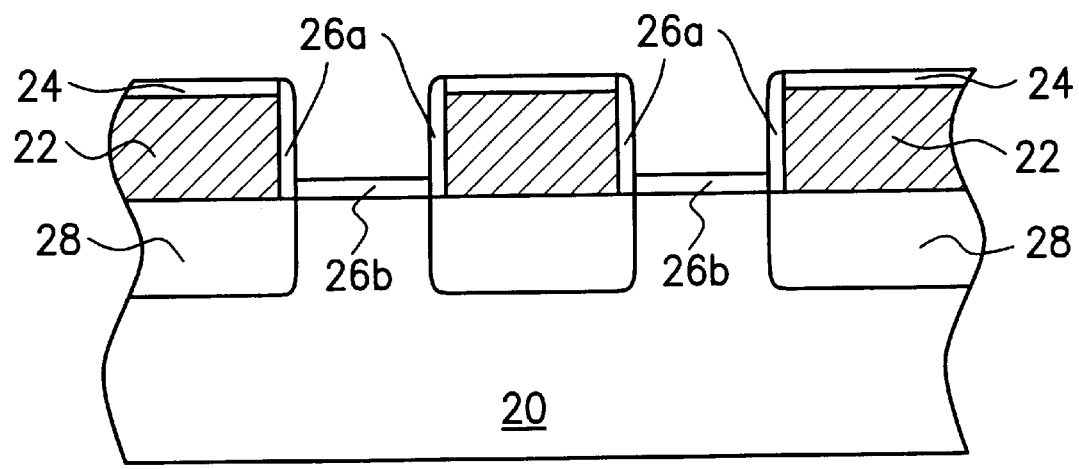
Figure 3B:
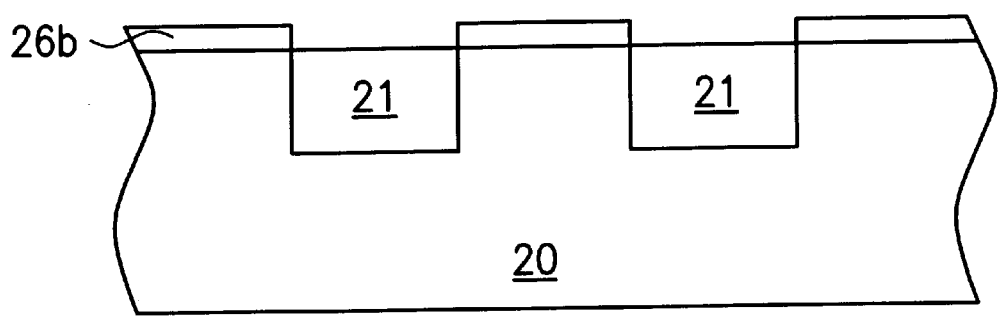

Next, as shown in FIGS. 3A and 3B, a thermal oxidation process is performed. At a high temperature and in an oxidizing atmosphere, oxygen will react with silicon in the silicon layer to form a silicon oxide layer 26a over the sidewalls of the bottom conductive layer 22 (because the bottom conductive layer 22 is a polysilicon layer). Similarly, silicon in the substrate will react with oxygen to form a gate oxide layer 26b, which has a thickness of about 100 Å to 400 Å, above the substrate 20 between the bottom conductive layer 22. At the same time, due to the oxidation reaction, the cap oxide layer 24 above the bottom conductive layer 22 will also be thickened. Thereafter, the substrate is heated to diffluse the implanted ions in the bottom conductive layer 22 forming ion-doped regions 28 in the substrate 20. These ion-doped regions later serve as source or drain regions.

Figure 4A:
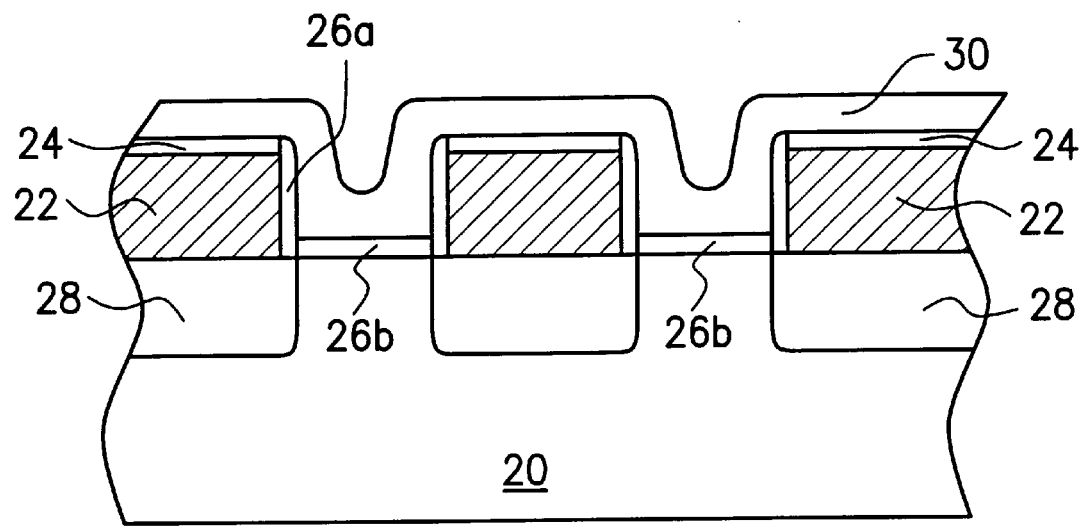
Figure 4B:
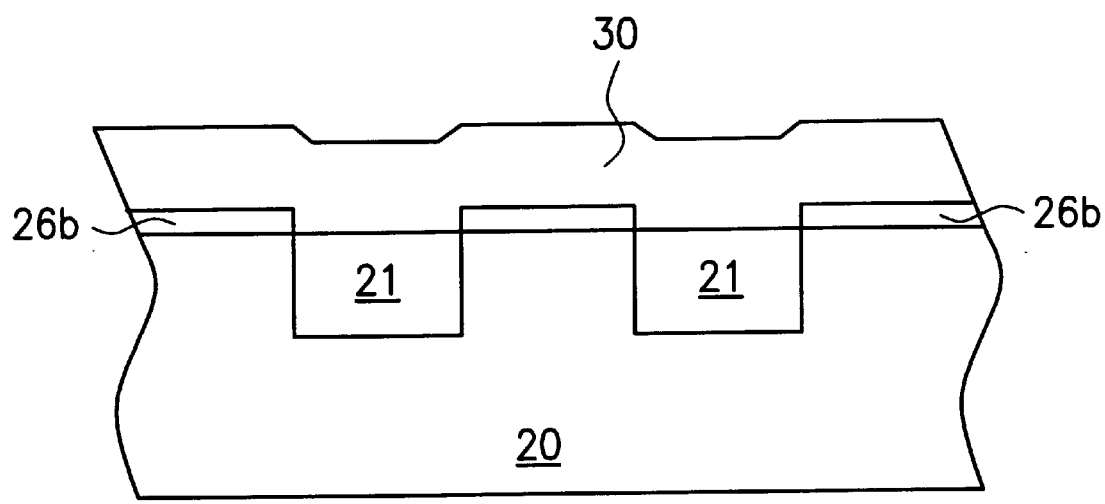

Next, as shown in FIGS. 4A and 4B, an insulating layer 30, for example, a silicon nitride layer, is formed over the cap oxide layer 24, the silicon oxide layer 26a and the gate oxide layer 26b. The silicon nitride layer can be deposited to a thickness of about 300 Å to 2000 Å, for example, using a chemical vapor deposition (CVD) method.

Figure 5A:
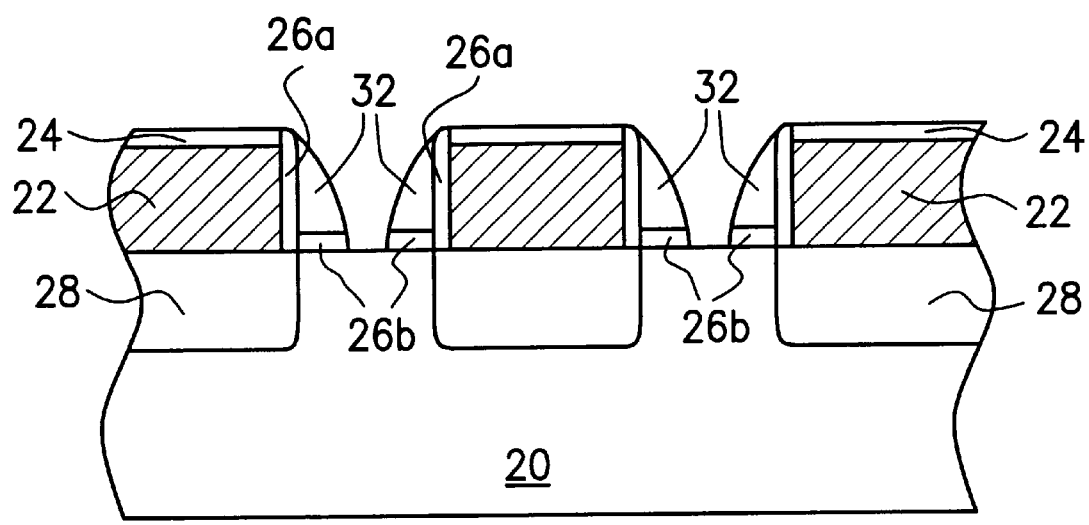
Figure 5B:
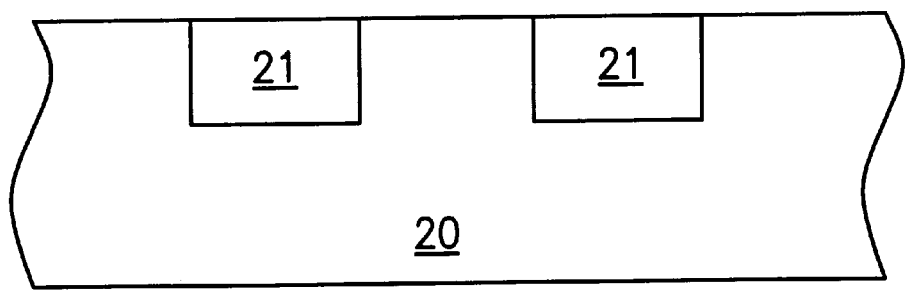

Next, as shown in FIGS. 5A and 5B, the insulating layer 30 is etched to form spacer structures adjacent to the silicon oxide layer 26a. The etching operation can be carried out using an anisotropic etching method. Subsequently, using the spacer structures 32 as masks, a portion of the gate oxide layer 26b is etched to expose the substrate 20 below as shown in FIG. 5A.

Figure 6A:
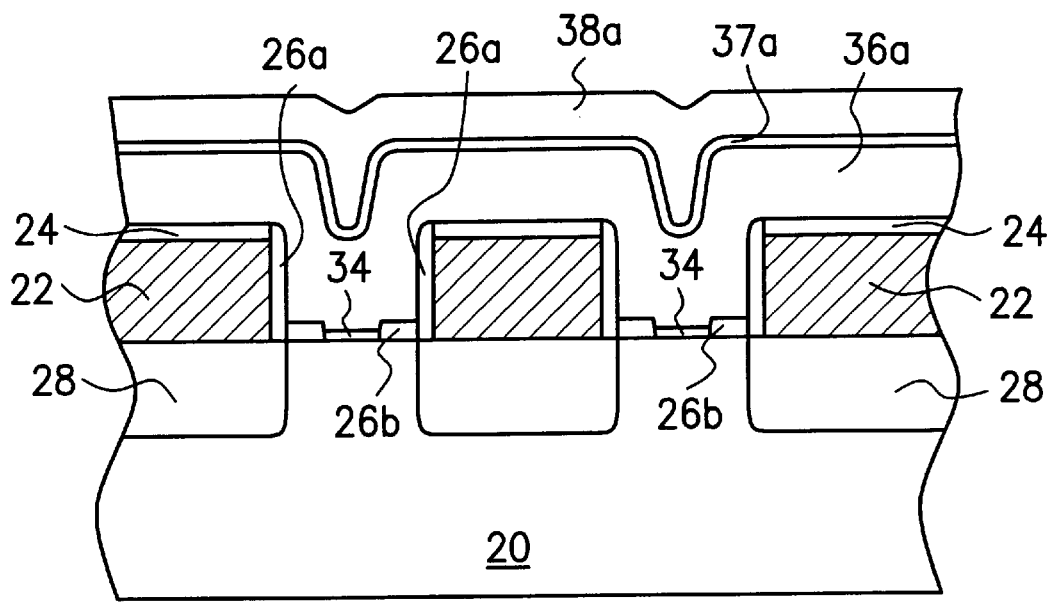
Figure 6B:
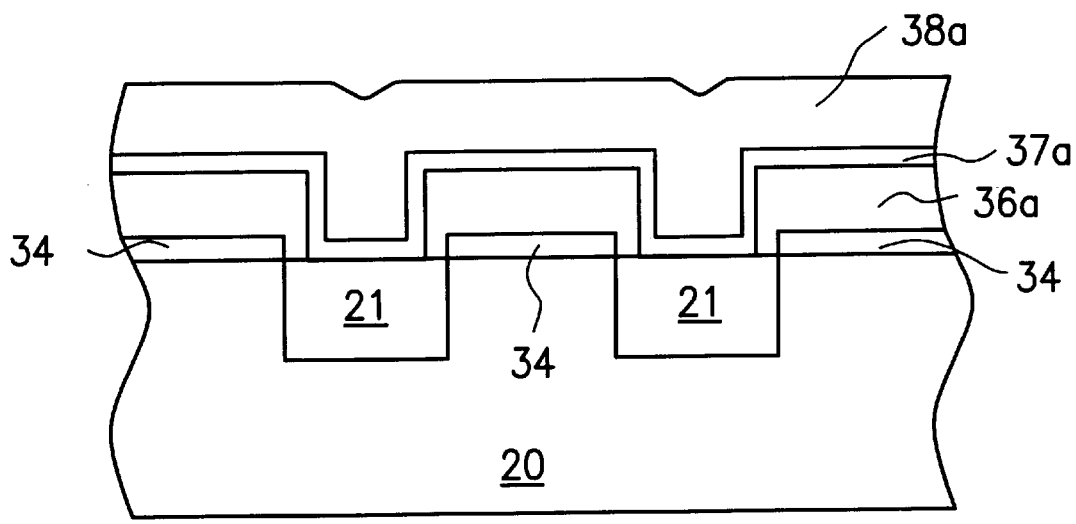

Next, as shown in FIGS. 6A and 6B, the spacer structures 32 are etched away to expose the gate oxide layer 26b, for example, using an isotropic wet etching method. Thereafter, a thermal oxidation process is carried out to form a tunneling oxide layer 34 in the narrow region between the gate oxide layer 26b. Since oxygen will react with silicon at a high temperature, silicon in the substrate between the gate oxide layer 26b will similarly reacts with oxygen to generate the tunneling oxide layer 34 above the substrate 20. Thickness of the tunneling oxide layer 34 is preferably controlled to within the range of 50 Å to 100 Å. The tunneling oxide layer 34 has a long narrow top profile, and is one of the main characteristics of this invention. Due to the oxidizing reaction during thermal oxidation, the gate oxide layer 26b will also be thickened somewhat. Next, a first conductive layer 36a is formed over the cap oxide layer 24, the silicon oxide layer 26a, the gate oxide layer 26b and the tunneling oxide layer 34. The first conductive layer 36a can be formed, for example, by depositing a polysilicon layer followed by doping ions into the polysilicon layer to increase its conductivity. Thereafter, a thin dielectric layer 37a, for example, having an oxide/nitride/oxide (ONO) composite structure, is formed over the first conductive layer 36a. Next, a second conductive layer 38a is formed over the dielectric layer 37a. The second conductive layer 37a can be formed, for example, by depositing a polysilicon layer followed by doping ions into the polysilicon layer to increase its conductivity.

Figure 7A:
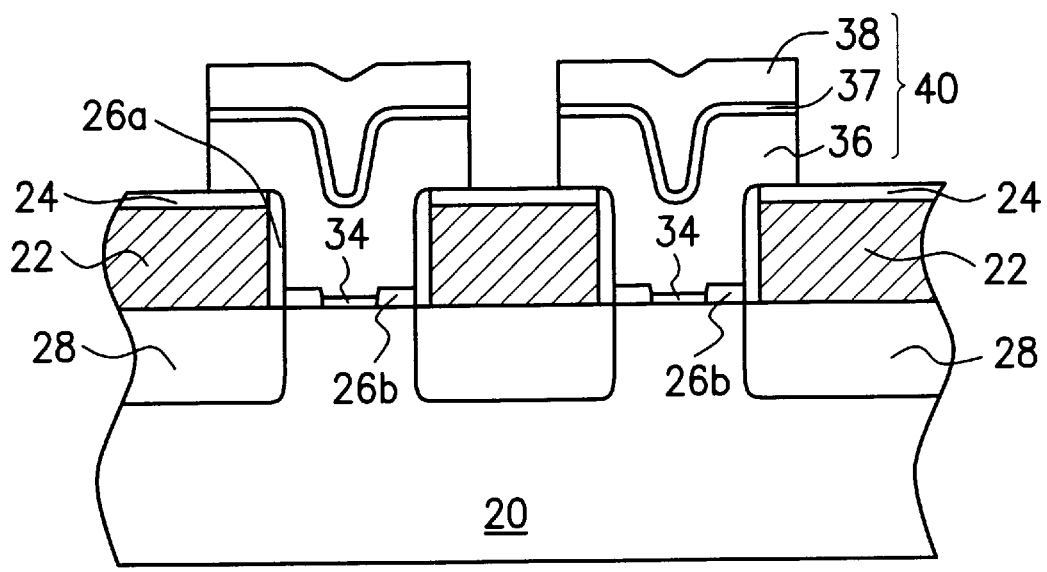
Figure 7B:
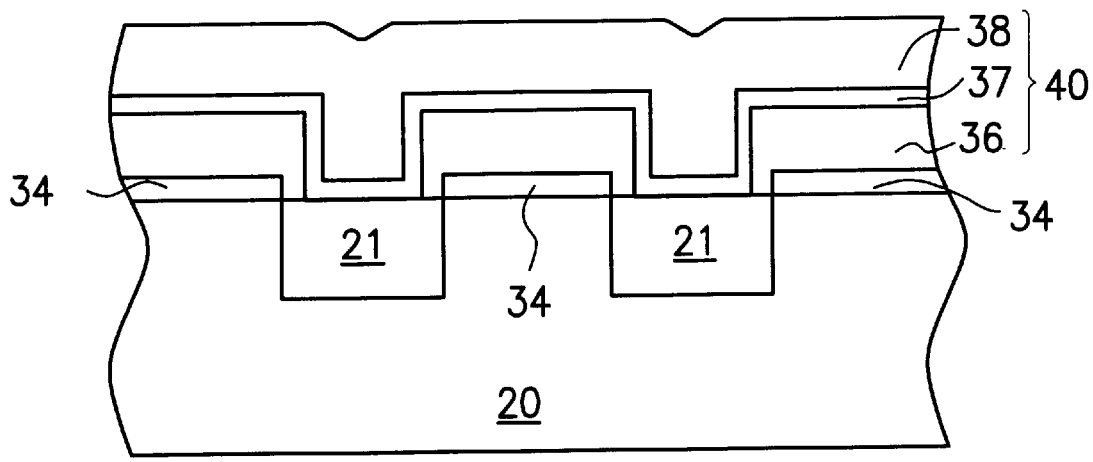

Next, as shown in FIGS. 7A and 7B, photolithographic and etching processes are performed. The second conductive layer 38a, the dielectric layer 37a and the first conductive layer 36a are etched sequentially to form a pattern of stacked gates 40. Each stacked gate 40 comprises a floating gate 36, a dielectric layer 37 and a control gate 38. Thus, the formation of the flash memory structure is complete.

As a summary, the flash memory cell structure and method of manufacture of this invention has several advantages, including:

1. The bottom conductive gate layer 22 is able to provide the stacked gate 40 a sharp undulating three-dimensional profile. Therefore, dimensions of the flash memory device can be reduced and the overlapping area between the floating gate and the control gate can be increased, thereby increasing the coupling ratio.

2. The tunneling oxide layer 34 has a long narrow top profile, hence able to reduce the area occupied by the tunneling oxide considerably. Consequently, the coupling ratio of the flash memory can be greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a high coupling ratio flash memory cell, comprising the steps of:

providing a semiconductor substrate, then forming an insulating region in the substrate;

forming a bottom conductive layer over the substrate, then implanting ions into the bottom conductive layer, thereafter forming a cap oxide layer over the bottom conductive layer;

performing photolithographic and etching processes to form a pattern in the bottom conductive layer and the cap oxide layer;

performing a first thermal oxidation operation to form silicon oxide layers on the sidewalls of the bottom conductive layer and a gate oxide layer over the substrate between the bottom conductive layers;

heating to diffuse the ions from the bottom conductive layers to the substrate for forming source/drain regions;

forming an insulating layer over the cap oxide layer, the silicon oxide layer and the gate oxide layer;

performing a first etching operation, etching the insulating layer to form spacer structures adjacent to the silicon oxide layers;

performing a second etching operation, etching a portion of the gate oxide layer to expose the substrate using the spacer structures as masks;

performing a third etching operation, etching away the spacer structures to expose the gate oxide layers;

performing a second thermal oxidation operation to form a tunneling oxide layer in the narrow region between the gate oxide layers, wherein the tunneling oxide layer has a long narrow top profile;

forming a floating gate above the cap oxide layer, the silicon oxide layer, the gate oxide layer and the tunneling oxide layer;

forming a thin dielectric layer over the floating gate;

forming a gate control layer over the thin dielectric layer; and performing photolithographic and etching processes to pattern the floating gate layer, the dielectric layer and the control gate layer forming a stacked gate structure.

2. The method of claim 1, wherein the step of forming the insulating region includes constructing a field oxide layer.

3. The method of claim 1, wherein the step of forming the insulating region includes constructing a shallow trench isolation region.

4. The method of claim 1, wherein the step of forming the bottom conductive layer includes depositing polysilicon using a chemical vapor deposition method.

5. The method of claim 1, wherein the step of forming the cap oxide layer includes depositing oxide preferably to a thickness of about 100 Å to 1000 Å using a chemical vapor deposition method.

6. The method of claim 1, wherein the step of implanting ions into the bottom conductive layer includes implanting arsenic (As) ions.

7. The method of claim 1, wherein the step of implanting ions into the bottom conductive layer includes implanting phosphorus (P) ions.

8. The method of claim 1, wherein the gate oxide layer preferably has a thickness of about 100 Å to 400 Å.

9. The method of claim 1, wherein the step of forming the insulating layer includes depositing silicon nitride preferably to a thickness of about 300 Å to 2000 Å using a chemical vapor deposition method.

10. The method of claim 1, wherein the step of forming the spacer structures includes using an anisotropic etching method.

11. The method of claim 1, wherein the step of performing the third etching operation includes using a wet etching method.

12. The method of claim 1, wherein the tunneling oxide layer preferably has a thickness of about 50 Å to 100 Å.

13. The method of claim 1, wherein the step of forming the floating gate layer includes depositing polysilicon.

14. The method of claim 1, wherein the step of forming the floating gate further includes performing an ion implantation operation to increase the electrical conductivity of the floating gate layer.

15. The method of claim 1, wherein the step of forming the dielectric layer includes fabricating an oxide/nitride/oxide (ONO) composite structure.

16. The method of claim 1, wherein the step of forming the control gate layer includes depositing polysilicon.

17. The method of claim 1, wherein the step of forming the control gate layer further includes performing an ion implantation operation to increase the electrical conductivity of the control gate layer.

\* \* \* \* \*